(12) United States Patent
Shiraishi et al.

(10) Patent No.: US 8,784,677 B2
(45) Date of Patent: Jul. 22, 2014

(54) PLASMA PROCESSING APPARATUS AND PLASMA PROCESSING METHOD

(75) Inventors: Daisuke Shiraishi, Hikari (JP); Akira Kagoshima, Kudamatsu (JP); Satomi Inoue, Kudamatsu (JP); Shigeru Nakamoto, Kudamatsu (JP)

(73) Assignee: Hitachi High-Technologies Corporation, Tokyo (JP)

( * ) Notice: Subject to any disclaimer, the term of this patent is extended or adjusted under 35 U.S.C. 154(b) by 656 days.

(21) Appl. No.: 12/856,725

(22) Filed: Aug. 16, 2010

(65) Prior Publication Data

US 2012/0018094 A1    Jan. 26, 2012

(30) Foreign Application Priority Data

Jul. 20, 2010    (JP) ................. 2010-162410

(51) Int. Cl.
*H01L 21/66* (2006.01)
*H01L 21/465* (2006.01)

(52) U.S. Cl.
USPC .......................................... 216/67; 438/710

(58) Field of Classification Search
None
See application file for complete search history.

(56) References Cited

U.S. PATENT DOCUMENTS

2009/0211706 A1    8/2009 Uchida et al.

FOREIGN PATENT DOCUMENTS

JP    2009-206275    9/2009

*Primary Examiner* — Allan Olsen
(74) *Attorney, Agent, or Firm* — Antonelli, Terry, Stout & Kraus, LLP.

(57) ABSTRACT

A plasma processing apparatus for applying an etching processing to a wafer by using at least two steps of the etching processing which operate with plasma formed within a pressure-reduced processing chamber, the wafer being located within the processing chamber inside a vacuum vessel, and having a mask on a silicon-composed substrate and a film structure, the film structure including processing-target films located under the mask, wherein the plasma processing apparatus is equipped with a function for processing another different wafer in such a manner that a processing condition at a precedent-stage step of the two steps of the etching processing in the processing of the different wafer is adjusted based on a result obtained by detecting a time which has elapsed until termination of a subsequent-stage step of the two steps of the etching processing.

4 Claims, 7 Drawing Sheets

FIG.7A

RECIPE-MODIFICATION-AMOUNT—CD-DIFFERENCE-VALUE DATABASE

| RECIPE NO. | WAFER PRODUCT INFORMATION | CD DIFFERENCE VALUE | RECIPE MODIFICATION AMOUNT |
|---|---|---|---|
| 1 | PRODUCT A | | |
| | PRODUCT B | | |
| 2 | PRODUCT C | | |
| ⋮ | ⋮ | ⋮ | ⋮ |

FIG.7B

CD-TARGET-VALUE DATABASE

| RECIPE NO. | WAFER PRODUCT INFORMATION | CD TARGET VALUE |
|---|---|---|
| 1 | PRODUCT A | |
| | PRODUCT B | |
| 2 | PRODUCT C | |
| ⋮ | ⋮ | ⋮ |

FIG.7C

END-POINT-TIME—CD DATABASE

| RECIPE NO. | WAFER PRODUCT INFORMATION | END-POINT TIME | CD |
|---|---|---|---|
| 1 | PRODUCT A | | |
| | | | |
| | | | |
| | | | |
| | | | |
| | PRODUCT B | | |
| | | | |
| | | | |
| | | | |
| 2 | PRODUCT C | | |
| | | | |
| | | | |
| ⋮ | ⋮ | ⋮ | ⋮ |

PLASMA PROCESSING APPARATUS AND PLASMA PROCESSING METHOD

BACKGROUND OF THE INVENTION

The present invention relates to a plasma processing apparatus for applying an etching processing to a processing-target substrate-like sample by using plasma formed within a processing chamber. Here, an example of this kind of sample is a semiconductor wafer located within the processing chamber inside a vacuum vessel. More particularly, it relates to a plasma processing apparatus which is equipped with a configuration for adjusting a processing condition for another different wafer by using a detection result of the etching processing.

In a plasma processing apparatus used in the semiconductor-device fabrication process, and in particular, in a plasma processing apparatus for applying an etching processing to the film structure located on the surface of a sample such as a semiconductor wafer, the wafer's etching machining is generally performed in accordance with the following process: Namely, an etching gas is introduced into a vacuum container. Next, plasma discharge is generated under a reduced-pressure condition. Moreover, radicals or ions, which are generated within this plasma, are caused to react with the wafer surface, i.e., the target to be processed. In the technologies like this, however, there has been a significant increase in the influence of a variation in the machining result by the etching processing with respect to a variation in the processing condition. Here, this significant increase has arisen in recent years in accompaniment with the microminiaturization of semiconductor devices. Accordingly, even if the plasma processing apparatus performs the etching processing of plural pieces of wafers using a constant set recipe, various types of outer disturbances occurring during the etching processing have prevented the resultant configuration by the machining (which is obtained as a result of the etching processing) from being formed and obtained with a high reproducibility maintained. As a consequence, it has become increasingly difficult to obtain the stable etching-machining performance.

The technology which has been considered as a one for solving the problems like this is as follows: The judgment on the end point of the etching processing is made by detecting a phenomenon which is specific to the development of the etching processing from the light-emission within the plasma generated inside the processing chamber. As the technology concerning the judgment on the end point like this, there has been known a technology disclosed in, e.g., JP-A-2009-206275. According to this related art, the high-accuracy end-point judgment can be implemented in accordance with the following process: Namely, a regression straight line regarding data about intensity of the light-emission of the plasma is created, using the data which is detected from the light-emission acquired during time-period of the etching processing. Next, the above-described judgment can be implemented by taking advantage of the distance between this regression straight line and time-sequence data about the intensity of the light-emission which is sequentially detected during the detection.

SUMMARY OF THE INVENTION

In the above-described related art, the problem has arisen from a reason that only an insufficient consideration has been given to the following point: Namely, this art has been devised in order to stabilize the etching-machining performance by carrying out the judgment on the end point of the etching processing. The accuracy of the machined configuration obtained by the etching processing, however, is significantly influenced by the accuracy of the judgment on the end point of the etching processing.

On account of this point, when processing a film whose judgment on the end point is difficult to make, the accuracy of the machining does not become stable. Moreover, when continuously processing a film structure including plural pieces of films, such as when using the configuration of an after-machining film as a mask, and processing a film which is located under this after-machining film, it turns out that the accuracy of the machining dimension in the over-located film exerts an influence on the accuracy of the configuration dimension of the under-located film. As a result, if the accuracy of the processing of the over-located film is low, and in particular, if the accuracy of the end point of the processing is low, the accuracy of the machining dimension of the entire film structure becomes damaged. Accordingly, there has existed a problem that the stability and reproducibility of the etching processing becomes lowered.

Furthermore, when continually processing plural pieces of wafers within a processing chamber inside a particular processing apparatus, during the processing of particular pieces of wafers out of the plural pieces of ones, the processing may be carried out such that the processing condition is made appropriate into an extent which permits the accuracy of the processing to fall into a predetermined range. In accompaniment with an increase in the number of the wafers processed, however, the internal condition of the processing chamber varies. As a result, under the initial processing condition, the after-processing dimension and configuration deviate from the desirable range of accuracy. Consequently, in this point as well, there has existed the problem that the stability and reproducibility of the etching processing becomes damaged. In the above-described related art, no consideration has been given to the following point: Namely, it becomes necessary to adjust the processing condition in response to the above-described fact that the environment or state inside the processing chamber varies in a time-elapsed manner.

It is an object of the present invention to provide a plasma processing apparatus and a plasma processing method which make it possible to enhance the stability or reproducibility of the etching processing by reducing a variation in the after-machining dimension occurring from the etching processing.

The above-described object is accomplished by providing a plasma processing apparatus for applying an etching processing to a wafer by using at least two steps of the etching processing which operate with plasma formed within a pressure-reduced processing chamber, the wafer being located within the processing chamber inside a vacuum vessel, and having a mask on a silicon-composed substrate and a film structure, the film structure including processing-target films located under the mask, wherein the plasma processing apparatus is equipped with a function for processing another different wafer in such a manner that a processing condition at a precedent-stage step of the two steps of the etching processing in the processing of the different wafer is adjusted based on a result obtained by detecting a time which has elapsed until termination of a subsequent-stage step of the two steps of the etching processing.

Also, the above-described object is accomplished by providing a plasma processing method, including the steps of locating a wafer within a pressure-reduced processing chamber inside a vacuum vessel, the wafer having a mask on a silicon-composed substrate and a film structure, the film structure including processing-target films located under the mask, forming plasma within the processing chamber, and after that, applying an etching processing to the film structure using at least two steps of the etching processing, wherein another different wafer is processed in such a manner that a processing condition at a precedent-stage step of the two steps of the etching processing in the processing of the different wafer is adjusted based on a result obtained by detecting a time which has elapsed until termination of a subsequent-stage step of the two steps of the etching processing.

Furthermore, the above-described object is accomplished by providing the plasma processing method, further including the steps of processing the processing-target films at the precedent-stage step during a time-interval determined in advance, detecting light-emission of the plasma formed during the processing of the processing-target films at the subsequent-stage step thereby to judge an end point of this processing, and adjusting the processing condition at the precedent-stage step in correspondence with a long-or-short relationship of the detected time until the termination of the subsequent-stage step relative to a predetermined time.

Still further, the above-described object is accomplished by providing the plasma processing method, wherein the processing-target films of the film structure include a reflection-preventing film and a film, the antireflection film being located under the mask, and being composed of an organic material, the film being located under the antireflection film, and being composed of silicon nitride, the precedent-stage step processing the antireflection film, and the subsequent-stage step processing the film composed of the silicon nitride.

Still further, the above-described object is accomplished by providing the plasma processing method, further including the steps of processing the antireflection film at the precedent-stage step using a gas whose composition includes fluorocarbon and nitrogen, and processing the film composed of the silicon nitride at the subsequent-stage step using a gas whose composition includes fluorocarbon.

Other objects, features and advantages of the invention will become apparent from the following description of the embodiments of the invention taken in conjunction with the accompanying drawings.

BRIEF DESCRIPTION OF THE DRAWINGS

FIGS. 7A to 7C are tables for illustrating overviews of the configurations of the information stored into the databases illustrated in FIG. 2.

DETAILED DESCRIPTION OF THE INVENTION

Figure 1:
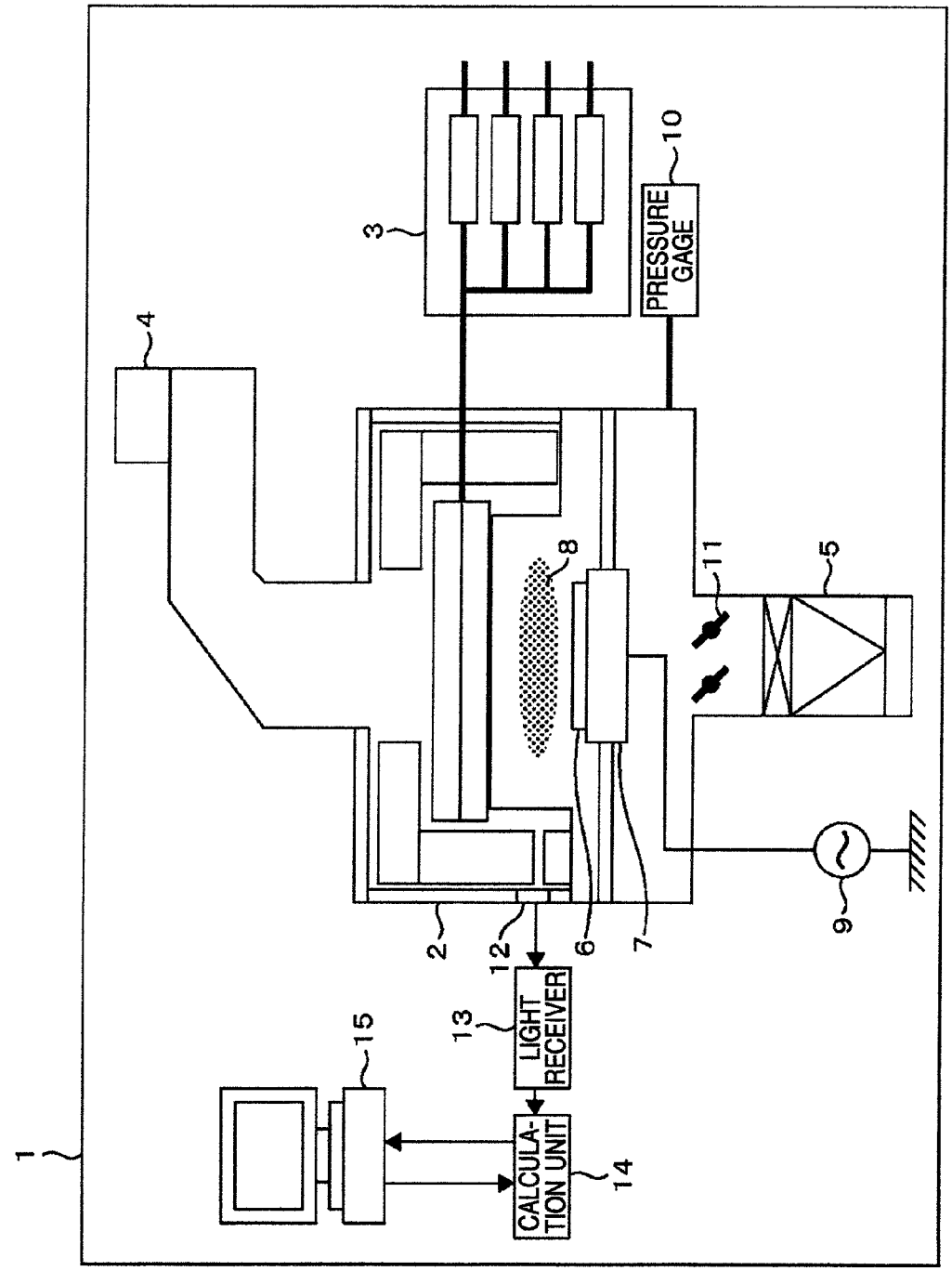
FIG. 1 is a schematic diagram for explaining an overview of the configuration of a plasma processing apparatus according to an embodiment of the present invention.

Hereinafter, referring to the drawings, the explanation will be given below concerning an embodiment of the present invention.

Embodiment

Hereinafter, referring to FIG. 1 through FIG. 6, the explanation will be given below regarding the embodiment of the present invention.

FIG. 1 is a schematic diagram for explaining an overview of the configuration of a plasma processing apparatus according to the embodiment of the present invention. The plasma processing apparatus 1 according to the present embodiment includes a processing chamber 2 located inside a vacuum vessel, a mass flow controller 3 for adjusting the supply amount and rate of a processing gas supplied into the processing chamber 2, a plasma-generation-use high-frequency power supply 4 for forming an electric field which is supplied for generating plasma 8 by exciting the processing gas supplied into the processing chamber 2, and an exhaust device 5 including a vacuum pump for exhausting the gas inside the processing chamber 2. Also, a sample stage 7 is located under a space in which the plasma inside the processing chamber 2 of the plasma processing apparatus 1 is formed. Here, a wafer 6, i.e., the processing target, is mounted on the upper surface of the sample stage 7, thereby being held.

The processing gas used for applying the etching processing is introduced into the processing chamber 2 via the mass flow controller 3. Moreover, the high-frequency electric field of a predetermined frequency (e.g., 2.45 GHz), and if necessary, a magnetic field excite particles of the processing gas, thereby generating the plasma 8. Here, the high-frequency electric field is formed by the plasma-generation-use high-frequency power supply 4, then being introduced into the processing chamber 2 from over the processing chamber 2 by a propagation unit such as a waveguide located over the processing chamber 2. Also, the magnetic field is supplied into the processing chamber 2 from a magnetic-field generation unit. This generation unit is located along over and side outer circumferences of the processing chamber 2 in a manner of surrounding the processing chamber 2. Furthermore, charged particles (i.e., ions) within the plasma 8 are attracted by a bias electric field, thereby being caused to collide with a thin film that is formed and located in advance on the surface of the wafer 6. Here, the bias electric field is formed by a high-frequency electric power over the upper surface of the sample stage 7 or the upper surface of the wafer 6 held on a mounting surface of the sample stage 7, i.e., the upper surface thereof. This high-frequency electric power is supplied from a bias-use high-frequency power supply 9, which is connected a conductor-formed electrode located inside the sample stage 7.

The above-described collision with the thin film activates the surface of the wafer 6. This activation promotes the chemical and physical interaction between the reactive particles within the plasma 8 and the material of which the film is composed, thereby making a development in the etching processing of the target film. Incidentally, the pressure inside the processing chamber 2 is maintained at an appropriate one in accordance with the following process: Namely, a measurement value acquired from a pressure gage 10 is compared with the reference value. Next, based on the comparison result therebetween, the exhaust-amount rate is adjusted by adjusting the position of rotation angle of a variable conductance valve 11. Here, the valve 11 is equipped with plural pieces of plates for adjusting the area of an aperture of a channel. Also, this channel is located in the horizontal direction, rotates around the axis, and passes through between the inside of the processing chamber 2 and the exhaust device 5.

The intensity of the light-emission of the plasma 8 formed during the processing is detected by being observed by a light receiver 13 via an observation window 12. Here, the observation window 12 is located in a wall material of the vacuum vessel, i.e., the side wall of the processing chamber 2, and is composed of a light-transparent material. A signal about the light-emission intensity of the plasma 8 detected by the light receiver 13 is transmitted to a calculation unit 14 of a control device which is located in a manner of being communicable with this light receiver 13. The calculation unit 14 calculates or detects predetermined amounts from the signal that the calculation unit 14 has received. Namely, after having received the signal indicating the light-emission intensity of the plasma 8, the calculation unit 14 calculates, e.g., an amount (i.e., recipe modification amount) in which the condition for an etching processing that will be performed with respect to the next wafer should be modified. The calculation unit 14 calculates this recipe modification amount using a program, thereby setting the operation of the plasma processing apparatus 1. Here, this program is stored in a storage unit such as RAM or hard disc which is located inside the calculation unit 14, or which is connected to the calculation unit 14 in a manner of being communicable therewith via a communications unit.

The recipe modification amount that should be set with respect to the next wafer is transmitted to a control unit 15. Using the information on the recipe modification amount transmitted thereto, the control unit 15 modifies the value of the recipe that is stored in a storage unit located inside the control unit 15 or in a separated location connected to the control unit 15 in a manner of being communicable therewith. In this way, the control unit 15 calculates the recipe for the etching processing (i.e., the condition for the etching processing) with respect to the next wafer. The control unit 15 in the present embodiment is the following device: Namely, the control unit 15 is connected via a communications unit to the above-described components, such as the mass flow controller 3, the exhaust device 5, the plasma-generation-use high-frequency power supply 4, the magnetic-field generation unit, the bias-use high-frequency power supply 9, the pressure gage 10, and a rotation driving device for the variable conductance valve 11. The control unit 15 receives signals issued from these components, then issuing signals for instructing necessary operations to these components, and controlling their operations.

The next wafer 6 is processed within the processing chamber 2 inside the plasma processing apparatus 1. Here, the operation of the plasma processing apparatus 1 is adjusted in accordance with the instruction issued from the control unit 15 on the basis of the value of the recipe that has been newly set by being adjusted. Even during the processing of the wafer 6, the control unit 15 calculates or detects adjustment amounts of the operations on the basis of the results of detecting the sensor information issued from the respective components as described above. Furthermore, the control unit 15 issues the instruction signals to the necessary respective components, and adjusts their operations, thereby exerting a feedback control over the operation of the plasma processing apparatus 1.

Figure 3A:
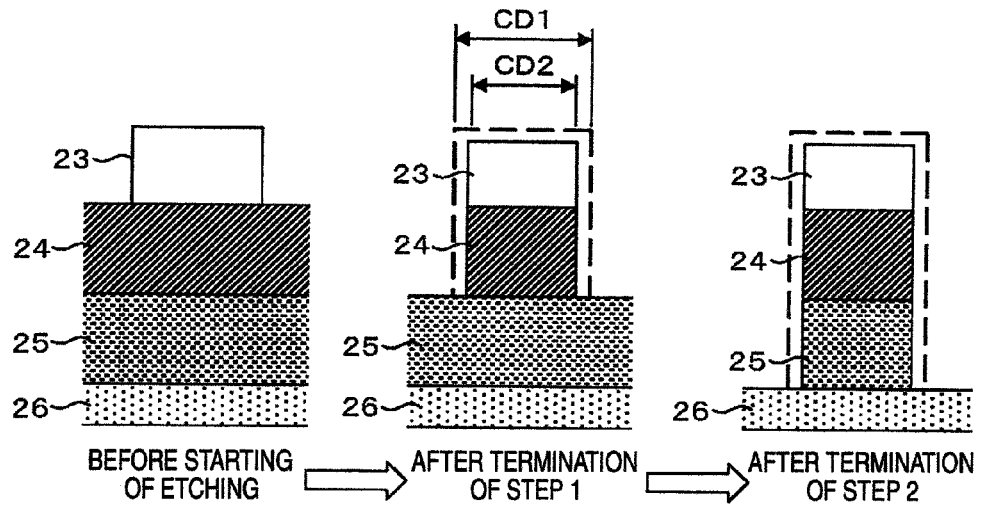
FIGS. 3A and 3B are longitudinal cross-sectional diagrams for schematically explaining a film structure, which is selected as being the target for the processing by the plasma processing apparatus according to the embodiment of the present invention illustrated in FIG. 1, and which is located in advance on the surface of a substrate-like sample such as a semiconductor wafer.
Figure 3B:
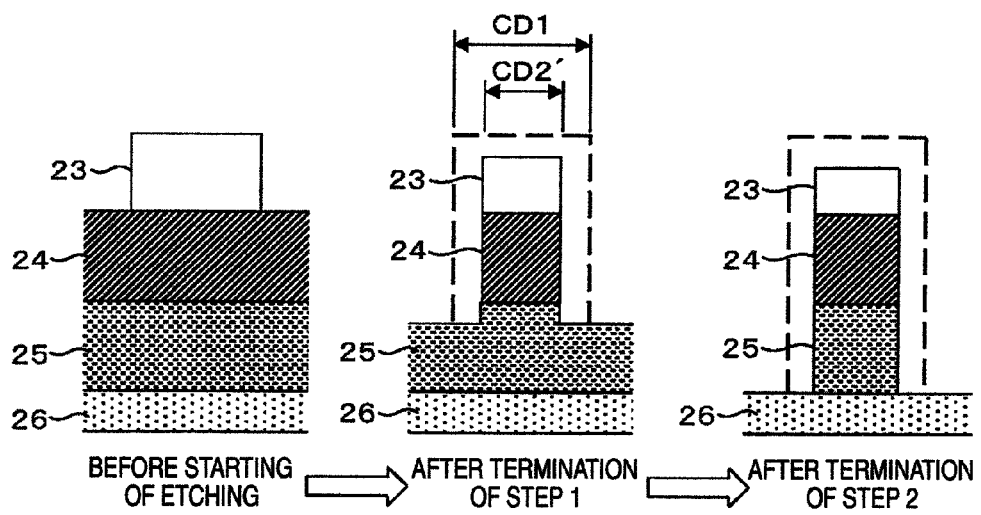

Next, referring to FIGS. 3A and 3B, the explanation will be given below concerning a film structure which is selected as being the target for the processing performed by the present embodiment. FIGS. 3A and 3B are longitudinal cross-sectional diagrams for schematically explaining this film structure. Here, this film structure is selected as being the target for the processing performed by the plasma processing apparatus according to the embodiment of the present invention illustrated in FIG. 1, and is located in advance on the surface of a substrate-like sample such as a semiconductor wafer. In the present diagrams, right and left end portions of each schematic diagram are omitted.

FIG. 3A illustrates cross-sectional configurations of a wafer at an initial point-in-time of its etching processing in the case of processing plural pieces of wafers continually or continuously. FIG. 3B illustrates cross-sectional configurations of a wafer at a point-in-time when, in the case of processing the plural pieces of wafers continually or continuously, predetermined pieces of wafers out of the plural pieces of ones have been processed.

The film structure including processing-target films, which is located on the surface of a wafer in the present embodiment, is equipped with the following configuration: Namely, plural layers of films are multilayered on a silicon-composed undercoating film 26 in such a manner that these films are adjacent to each other in the up-and-down direction. A photoresist 23, which constitutes the upper-most layer of these layers of films, is a thin film that functions as a mask composed of an organic material.

In the present embodiment, the following etching processing is performed: Namely, an etching target film A 24 and an etching target film B 25, which are located under the photoresist 23, are etched using the photoresist 23 as the mask. Then, the etching processing is terminated up onto the surface of the undercoating film 26. In particular, the etching processing is carried out such that a processing condition at the time of processing the etching target film A 24 and a processing condition at the time of processing the etching target film B 25 are made different from each other. Here, the etching processing based on the former processing condition is designated as a step 1, and the etching processing based on the latter processing condition is designated as a step 2.

Namely, the etching target film A 24 is etched at the step 1 of the etching processing, and the etching target film B 25 is etched at the step 2 of the etching processing. Also, as will be described later, at the step 1 of the etching processing, the judgment on the end point of the etching processing based on the detection of the light-emission of the plasma formed during the etching processing is difficult to make. Accordingly, the etching processing at the step 1 is terminated by detecting and counting the lapse of a predetermined time. Meanwhile, at the step 2 of the etching processing, the judgment on the end point based on the light-emission of the plasma can be carried out.

Moreover, during the etching processing at the step 1 of the etching target film A 24, usually, the photoresist 23 is also etched in the transverse direction. As a result, the transverse width (which, hereinafter, will be referred to as "CD") of the etching pattern of the etching target film A 24 is also etched, and thus becomes smaller. This is because the etching target film A 24 is located under the photoresist 23, and because its etching processing is performed using the photoresist 23 as the mask. Actually, in FIG. 3A, the transverse width CD 2 of the etching pattern of the etching target film A 24 after the etching processing at the step 1 becomes smaller than the transverse width CD 1 of the etching pattern thereof before the starting of the etching processing at the step 1. Furthermore, CD 2, i.e., the CD value at the end point-in-time of the etching processing at the step 2 of the etching target film B 25, whose etching processing is performed using the etching target film A 24 as well as the photoresist 23 as the masks, is dominantly influenced by the transverse width of the etching pattern of the masks. Consequently, it turns out that CD 2 is dominantly influenced by the state of the etching processing at the step 1.

When the etching processing is started in the state of the processing chamber (i.e., chamber state 1) at the initial point-in-time of the etching processing of the plural pieces of wafers, the step 1 of the etching processing is started from the left-end-indicated wafer cross-sectional configuration before the starting of the etching processing. At the step 1, the etching processing of the etching target film A 24 is carried out during an etching time-interval which is appropriately determined in advance.

The time-interval determined in advance like this is determined as follows: A time, which ranges from the initial point-in-time when the etching processing of the etching target film A 24 is started (and the etching processing develops) to a point-in-time when the surface of the etching target film B 25 located under the film A 24, or an interfacial plane therewith comes to appear, is determined by being processed using such a method as an experiment regarding the dimension (i.e., thickness) of the film structure of the wafer determined as the criterion, and the quality of the material.

The central diagram illustrated in FIG. 3A illustrates the wafer cross-sectional configuration of the state where the etching step 1 like this is terminated. As explained above, at the etching step 1, the transverse width of the etching pattern is also reduced from CD 1 before the starting of the etching step 1 down to CD 2 after the termination of the etching step 1.

Next, the etching step 2 is carried out. At the etching step 2, the etching target film B 25 is subjected to the etching processing. At the etching step 2, the judgment on the end point of the etching processing is carried out by detecting the light-emission of the plasma formed during the etching processing. Accordingly, the etching step 2 is terminated at a point-in-time when it is judged that the undercoating film 26 comes to appear. The right-end diagram illustrated in FIG. 3A illustrates the wafer cross-sectional configuration after the termination of the etching step 2.

FIG. 3B illustrates the state of the processing chamber (i.e., chamber state 2) at the point-in-time when the processing of the predetermined pieces of wafers has been carried out. FIG. 3B illustrates the wafer cross-sectional configurations at the time when the processing of the predetermined pieces of wafers has been carried out. Being similar to the case of the above-described chamber state 1, the etching step 1 is carried out such that the etching processing is started from the left-end-indicated wafer cross-sectional configuration before the starting of the etching processing. At the etching step 1, the etching target film A 24 is subjected to the etching processing.

At this time, the etching processing at the etching step 1 is performed under the processing condition that is so set as to become suitable for the chamber state 1 in FIG. 3A. However, the state of the processing chamber, such as state of adhesion substance and consumption state of material inside the processing chamber, has become different from the chamber state 1. On account of this situation, it turns out that the processing characteristics of the etching target film A 24 become different from the processing characteristics in FIG. 3A. For example, when the rate of the development of the etching processing has become faster, if the etching processing is performed under the same time condition as the one specified in the setting in FIG. 3A, the etching continues even after the etching of the etching target film A 24 has been terminated. As a result, it turns out that the development of the etching is made into even the etching target film B 25.

The central diagram illustrated in FIG. 3B illustrates the wafer cross-sectional configuration at a point-in-time when the step 1 is terminated in the state like this. As is exactly illustrated in this diagram, at the end point-in-time of the step 1, the etching processing at the step 1 is carried out into a further extent from the interfacial plane between the etching target film A 24 and the etching target film B 25. Namely, the etching target film B 25 has been etched with the photoresist 23 used as the mask. Moreover, CD 2', i.e., the CD value after the termination of the step 1, turns out to become smaller as compared with the chamber state 1.

The step 2 is carried out from this state. At the step 2, the etching target film B 25 is subjected to the etching processing. At the step 2, the judgment on the end point of the etching processing is carried out as described above. Accordingly, the step 2 is halted at the point-in-time when the undercoating film 26 comes to appear. The right-end diagram illustrated in FIG. 3B illustrates the wafer cross-sectional configuration at this point-in-time. In the etching processing at the step 2 in this chamber state 2, however, the state of the wafer is as follows: Namely, the etching processing of the etching target film B 25 has been performed already at the end point-in-time of the step 1, and thus the remaining film thickness of the film B 25 has decreased. Consequently, the etching target film B 25 at the step 2 has become relatively thinner as compared with the one in the chamber state 1. On account of this situation, it turns out that the time-interval ranging from the point-in-time when the end-point judgment is carried out to the point-in-time when the etching processing is halted becomes shorter than the case in the chamber state 1.

As described above, there exists the case where, even if the end-point judgment on the etching target film B 25 located under the etching target film A 24 is carried out, the dimension of the configuration obtained by the etching-machining processing varies. The reason for this phenomenon is as follows: Namely, the end-point of the processing of the over-located etching target film A 24 becomes inaccurate. This inaccuracy gives rise to a damage in the accuracy of the dimension of the over-located etching target film A 24 that functions as the mask for the processing of the under-located etching target film B 25.

The state like this is caused to occur in the following case, for example: In the film structure where the photoresist 23 and the etching target film A 24 are antireflection films (BARC) whose main raw material is carbon (C), and where the etching target film B 25 is a silicon nitride ($Si_3N_4$) film, and where the undercoating film 26 is a film composed of silicon (Si), the etching processing of the etching target film A 24 is carried out using fluorocarbon-based gas (such as $CF_4$) and nitrogen gas ($N_2$), and the etching processing of the etching target film B 25 is carried out using the fluorocarbon-based gas.

At the processing step where the etching target film A 24 is employed as the target, the etching processing develops such that the carbon within the etching target film A 24 and the nitrogen gas react with each other thereby to produce carbon nitride (CN). In a case where the etching target film B 25 is not composed of the nitrogen-based compound, the amount of the carbon nitride (CN) within the plasma decreases when the etching processing of the etching target film A 24 is terminated. Accordingly, taking advantage of the light-emission intensity change at, e.g., 387.0 nm (carbon nitride: CN) makes it possible to carry out the etching end-point judgment on the etching target film A 24. However, in a case where, like the present embodiment, the etching target film B 25 is composed of the silicon nitride ($Si_3N_4$), i.e., the nitrogen-based compound, the fluorocarbon-based gas (such as $CF_4$) and the silicon nitride ($Si_3N_4$) react with each other thereby to generate the carbon nitride (CN). This phenomenon continues to take place even after the etching processing of the etching target film A 24 is terminated, and the etching target film B 25 is exposed. Accordingly, it is difficult to detect the carbon-nitride (CN) light-emission intensity change at, e.g., 387.0 nm. In the case like this, the etching end-point detection becomes difficult to perform in the etching processing of the etching target film A 24. Consequently, it cannot be avoided to perform the etching processing with the use of a specified processing time. As a result, there occurs the CD variation as was explained in FIGS. 3A and 3B.

At the processing step where the etching target film B 25 is employed as the target, the etching processing develops such that the silicon (Si) within the etching target film B 25 reacts with the fluorocarbon-based gas (such as $CF_4$) thereby to produce silicon fluoride ($SiF_4$), and such that the nitrogen (N) within the etching target film B 25 reacts with the fluorocarbon-based gas (such as $CF_4$) thereby to produce the carbon nitride (CN). When the etching processing of the etching target film B 25 is terminated, and the undercoating film 26 is exposed, the amount of the carbon nitride (CN) within the plasma decreases. Accordingly, taking advantage of, e.g., the 387.0-nm (carbon nitride: CN) light-emission intensity change makes it possible to carry out the etching end-point judgment on the etching target film B 25. In this way, even if the end-point judgment is carried out at the subsequent-stage etching step, it is impossible to enhance the stability and reproducibility of the after-machining dimension as the final result. This is because the CD variation has occurred at the precedent-stage etching step.

In addition thereto, basically the same problem also occurs in the following case: Namely, the end-point detection is difficult, because the film thickness of the etching target film A 24 is thin, and the etching processing time thereof is short. In the present embodiment, the CD value has been mentioned as an example of the etching-machining performance. Not being limited to the CD value, however, this etching-machining performance can also be replaced by another etching-machining performance, such as electric characteristics of the semiconductor device. Also, in the present embodiment, the example has been mentioned where the two-layer etching-processing film is subjected to the etching processing. There is a possibility, however, that basically the same problem also occurs in the following case: Namely, a three-or-more-layer etching-processing film is subjected to the etching processing, or a one-layer etching-processing film is subjected to the etching processing at a plurality of steps.

Hereinafter, the explanation will be given below regarding the configuration of the embodiment for solving the problems like this. More concretely, the end-point judgment time at the subsequent-stage step is monitored. Then, in order to cause this end-point judgment time to come nearer to a target value, recipe values (such as, e.g., etching-step time, bias electric power, and gas ratio) are modified which correspond to a step that is at the precedent stage to the step at which the end-point judgment is to be made in the next wafer.

Figure 2:
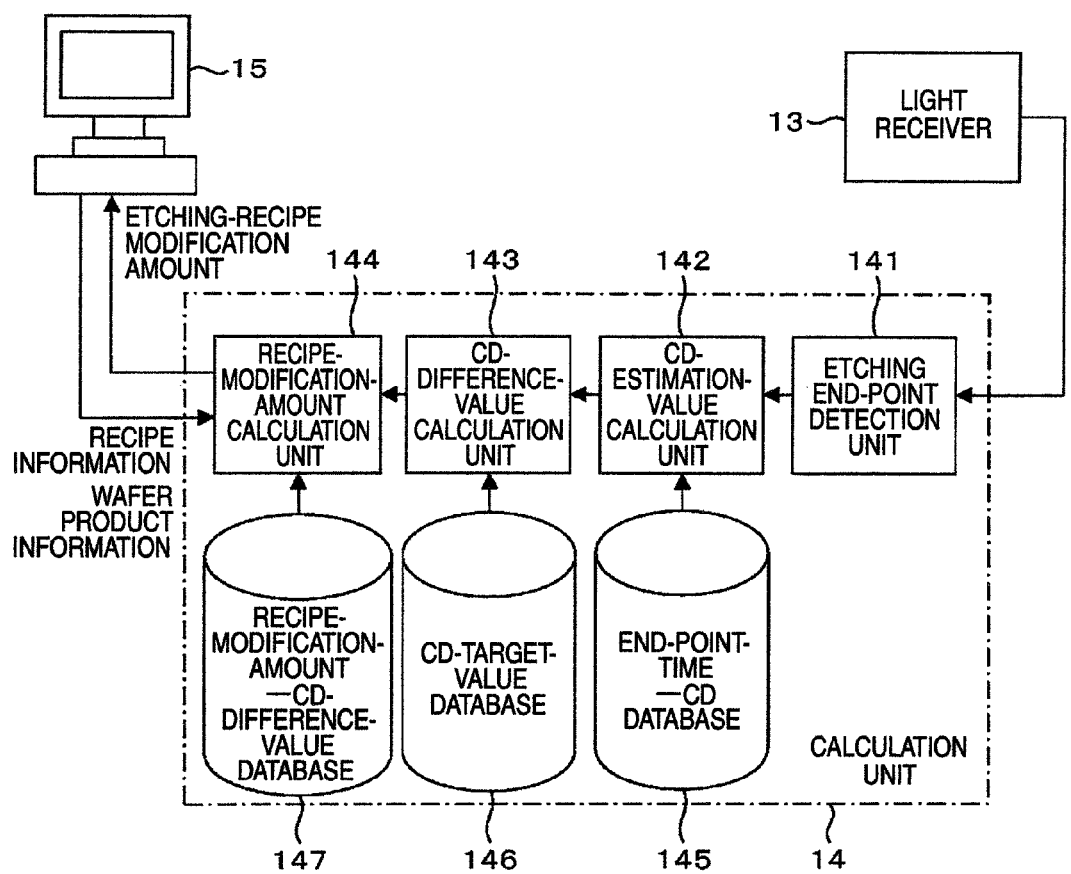
FIG. 2 is a block diagram for explaining an overview of the configuration of a calculation unit 14 according to the embodiment of the present invention illustrated in FIG. 1.

FIG. 2 is a block diagram for explaining an overview of the configuration of the calculation unit 14 according to the embodiment illustrated in FIG. 1. In the present diagram, a portion indicated as being each block indicates a portion which exhibits a particular function or effect, and which does not indicate a particular location or area of the calculation unit 14. Namely, one and the same location or area may be included within different blocks which exhibit different functions. Also, these blocks are connected to each other in a manner of being communicable with each other via a communications unit.

In the present embodiment, the signal about the light-emission intensity of the plasma 8, which is transmitted from the light receiver 13 to the calculation unit 14 on each predetermined sampling time-interval basis, is transmitted to an etching end-point detection unit 141 located inside the calculation unit 14. Using a calculator such as a CPU located inside the calculation unit 14, the etching end-point detection unit 141 calculates values such as a first-order or second-order differentiation value about the time-sequence signal transmitted thereto, thereby detecting a change in the signal. Moreover, the unit 141 defines, as the processing end-point point-in-time, a point-in-time when the unit 141 has detected the occurrence of the change by an amount determined in advance, then transmitting the end-point point-in-time to a CD-estimation-value calculation unit 142.

The CD-estimation-value calculation unit 142 calculates a CD estimation value, using the calculator, and using the information on the end-point point-in-time transmitted from the etching end-point detection unit 141, the recipe information or wafer product information received and acquired from the control unit 15, and information stored in an end-point-time-CD database 145 which is connected to the CD-estimation-value calculation unit 142 in a manner of being communicable therewith. Furthermore, the CD-estimation-value calculation unit 142 transmits this calculated CD estimation value to a CD-difference-value calculation unit 143.

The CD-difference-value calculation unit 143 calculates a difference (which, hereinafter, will be referred to as "CD difference value") between the CD estimation value and a CD target value, using the calculator, and using the CD estimation value transmitted thereto, and information stored in a CD-target-value database 146 which is connected to the CD-difference-value calculation unit 143 in a manner of being communicable therewith. In addition, the CD-difference-value calculation unit 143 transmits this calculated CD difference value to a recipe-modification-amount calculation unit 144.

The recipe-modification-amount calculation unit 144 calculates the etching-recipe modification amount, using the calculator, and using the CD difference value transmitted thereto, and information stored in a recipe-modification-amount-CD-difference-value database 147 which is connected to the recipe-modification-amount calculation unit 144 in a manner of being communicable therewith. Furthermore, the recipe-modification-amount calculation unit 144 transmits this calculated etching-recipe modification amount to the control unit 15.

Next, referring to FIGS. 7A to 7B, the explanation will be given below concerning the three databases used inside the calculation unit 14, i.e., the end-point-time-CD database 145, the CD-target-value database 146, and the recipe-modification-amount-CD-difference-value database 147. FIGS. 7A to 7C are tables for illustrating overviews of the configurations of the information stored into the databases illustrated in FIG. 2.

The end-point-time-CD database 145 illustrated in FIG. 7C includes at least four items, i.e., recipe No., wafer product information, end-point time, and CD. The plural pieces of wafer product information are made related with each recipe No. The values of the plurality of end-point times (i.e., processing times up to the end points), which are different from each other for each wafer 6 for fabricating the product device in the present embodiment, are the end-point times of the processing of the etching target film B 25 employed as the target by the processing at the step 2 in the film structure illustrated FIGS. 3A and 3B. In the etching processing of the film structure in the present embodiment, the lengths of the end-point times of the processing at the step 2 are dominantly influenced by the accuracy of the machining configuration obtained by the processing of the over-located etching target film A 24. Namely, the accuracy of the machining configuration obtained by the processing of the etching target film A 24 exerts the dominant influences onto the accuracy of the machining of the etching target film B 25, and eventually, onto the accuracy of the machining dimension obtained by the processing of the entire film structure. On account of this situation, there exists a correlation relationship between the times up to the end points and the CD values at the step 2. Accordingly, a database for indicating this correlation relationship can be created by storing the end-point times and the CD values in the processing of the fabrication-use wafers in such a manner that a one-to-one correspondence relationship is established therebetween.

The creation of the database like this allows the CD value to be detected by being selected or calculated based on the end-point time detected in each wafer 6 for fabricating the product device. The creation of the end-point-time-CD database 145 requires that, when the machining performance and the end-point time as explained in FIGS. 3A and 3B are varied, the end-point time and the CD value at that time be acquired in advance using such a method as an experiment.

Figure 4A:
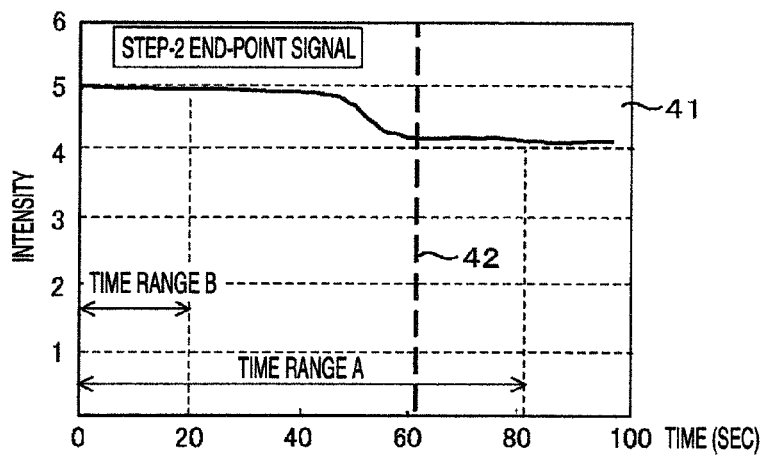
FIGS. 4A to 4C are graphs for illustrating examples of data which are necessary for creating an end-point-time-CD database 145 in the embodiment illustrated in FIG. 1.
Figure 4B:
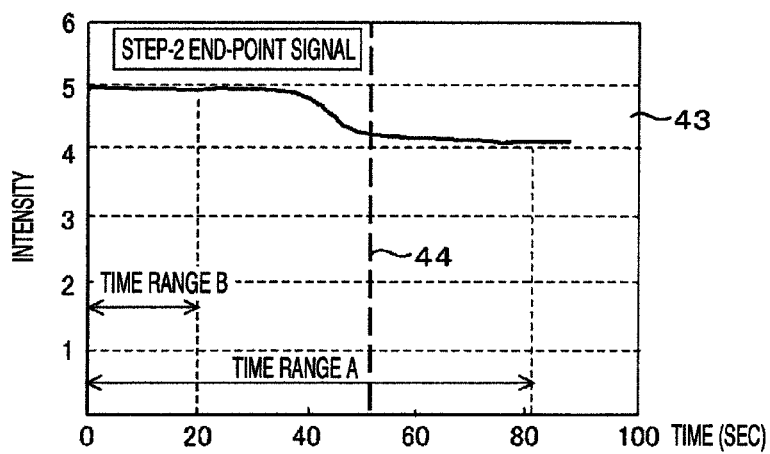
Figure 4C:
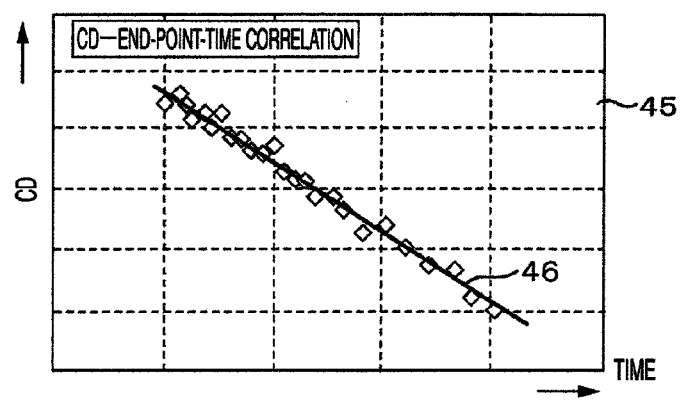

FIGS. 4A to 4C are graphs for illustrating examples of the data which are necessary for creating the end-point-time-CD database 145 in the embodiment illustrated in FIG. 1. The end-point signal 41 illustrated in FIG. 4A is a line for indicating the signal about the light-emission intensity of the plasma 8. This signal has been acquired at the step 2 when the etching processing is applied to the film structure in the chamber state 1 illustrated in FIGS. 3A and 3B. In this case, the end-point point-in-time 42 judged in the chamber state 1 is an about 60-second point-in-time.

The end-point signal 43 in the chamber state 2 illustrated in FIG. 4B is a line for indicating the signal about the light-emission intensity of the plasma 8. This signal has been acquired at the step 2 when the etching processing is applied to the film structure in the chamber state 2 illustrated in FIGS. 3A and 3B. Like the wafer cross-sectional configuration after the step 1 has been terminated in the chamber state 2 illustrated in FIG. 3B, this chamber state 2 is the state before the starting of the step 2 at which the end-point judgment is to be carried out. Accordingly, the etching processing has been already applied to the etching target film B 25, and thus the remaining film thickness of the film B 25 has become thinner than the one in the chamber state 1. On account of this situation, it turns out that the time-interval ranging from the point-in-time after the starting of the processing at the step 2 in the chamber state 2 to the end-point point-in-time 44 is shorter than the time-interval ranging from the point-in-time after the starting of the processing in the chamber state 1 to the end-point point-in-time 42.

In this way, the end-point time is detected in each of the plurality of chamber states in advance. Then, the CD value of each machined configuration obtained after each processing is measured and detected, thereby being acquired as the data. An example which is obtained by plotting the end-point times and CD values measured in the plurality of chamber states is a CD-end-point-time correlation graph 45 illustrated in FIG. 4C. This relationship between the end-point times and the CD values may be directly recorded into the end-point-time-CD database 145. There is a possibility, however, that the end-point time measurement values and the CD value measurement values may contain measurement errors. Accordingly, for the purpose of noise elimination, an approximation straight line 46 is calculated with respect to the CD-end-point-time correlation graph 45. Then, the relationship between the end-point times and the CD values in this approximation straight line 46 may be recorded into the end-point-time-CD database 145.

Also, a time average value of the end-point signals may be recorded into the item of the end-point time of the end-point-time-CD database 145. For example, if a comparison is made between a time average value of the signal intensities in the time range A in the end-point signal 41 in the chamber state 1 and a time average value of the signal intensities in the time range A in the end-point signal 43 in the chamber state 2, the latter value is found to be larger. In this way, the time average value of the end-point signals depends on the end-point times. Consequently, utilizing time average value instead of the end-point times is executable.

If, however, the signal intensities themselves of the end-point signals change depending on the chamber states, it is impossible to utilize the time average value of the end-point signals with no modification added thereto. In the case like this, it is advisable to utilize a value which is acquired by normalizing (e.g., dividing) the time average value of all of the end-point signals by a time average value of a partial assembly of the end-point signals. For example, a time average value of the signal intensities in the time range A in the end-point signals 41 and 43 is divided by a time average value of the signal intensities in the time range B therein. A value acquired by this division is utilized. This method permits the time average value to be utilized even if the signal intensities themselves of the end-point signals have changed.

Next, the explanation will be given below regarding the CD-target-value database 146. As illustrated in FIG. 7B, the CD-target-value database 146 includes at least three items, i.e., recipe No., wafer product information, and CD target value. The plural pieces of wafer product information are made related with each recipe No. The CD value, which is the optimum for each wafer 6 for fabricating each product device, is allocated to each wafer 6 such that a one-to-one correspondence relationship is established between the optimum CD value and each CD target value. This allocation makes it possible to calculate the difference between each CD estimation value and each CD target value. Also, it is allowable to add a string of setting the upper-limit and lower-limit values for each CD target value, and to add a function of generating an error if each CD estimation value has exceeded the upper-limit and lower-limit values.

Next, the explanation will be given below concerning the recipe-modification-amount-CD-difference-value database 147. As illustrated in FIG. 7A, the recipe-modification-amount-CD-difference-value database 147 includes at least four items, i.e., recipe No., wafer product information, CD difference value, and recipe modification amount. The plural pieces of wafer product information are caused to correspond to each recipe No. Each CD difference value and each recipe modification amount are allocated to each wafer 6 for fabricating each product device. The recipe which becomes the target for the modification is the processing condition at the step 1 at which the etching target film A 24 illustrated in FIGS. 3A and 3B is to be processed. The use of the database like this allows each recipe modification amount to be selected or calculated using each CD difference value. The creation of the recipe-modification-amount-CD-difference-value database 147 requires the following process: Namely, an experiment for detecting the CD value is made in such a manner that at least the recipe for the processing at the step 1 is modified into a different one in advance. Moreover, the modification amount and the CD value of each item of the recipe at that time are acquired, then being made related with each other.

Figure 5:
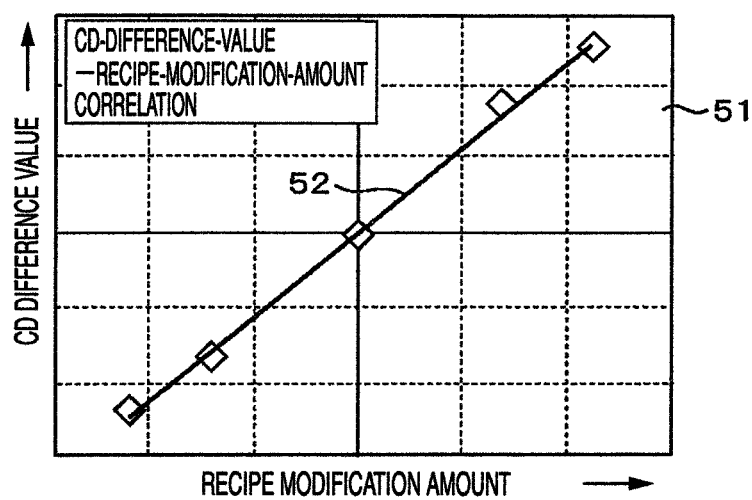
FIG. 5 is a graph for illustrating examples of data which are necessary for creating a recipe-modification-amount-CD-difference-value database 147 illustrated in FIG. 2.

FIG. 5 is a graph for illustrating examples of the data which are necessary for creating the recipe-modification-amount-CD-difference-value database 147 illustrated in FIG. 2. A CD-difference-value-recipe-modification-amount correlation graph 51 illustrated in FIG. 5 is a graph obtained as follows: Namely, first, the following experiment is made in advance: The recipe for the processing, whose target is the predetermined film structure illustrated in FIGS. 3A and 3B and in particular, the etching target film A 24, is carried out in such a manner that the recipe is caused to vary in a specified range. Next, this graph is created by plotting each recipe modification amount and each CD difference value at that time. Each CD difference value acquired in this experiment is a value which is obtained by subtracting each CD value obtained in the case where each recipe modification amount is equal to zero from each CD value obtained in the case of each processing where the recipe is caused to vary. This relationship between each recipe modification amount and each CD difference value may be directly recorded into the recipe-modification-amount-CD-difference-value database 147. There is a possibility, however, that the CD value measurement values may contain measurement errors. Accordingly, for the purpose of noise elimination, an approximation expression 52 is calculated and formed with respect to the CD-difference-value-recipe-modification-amount correlation graph 51. Then, the relationship between each recipe modification amount and each CD difference value in the approximation expression 52 may be recorded into the recipe-modification-amount-CD-difference-value database 147.

Figure 6:
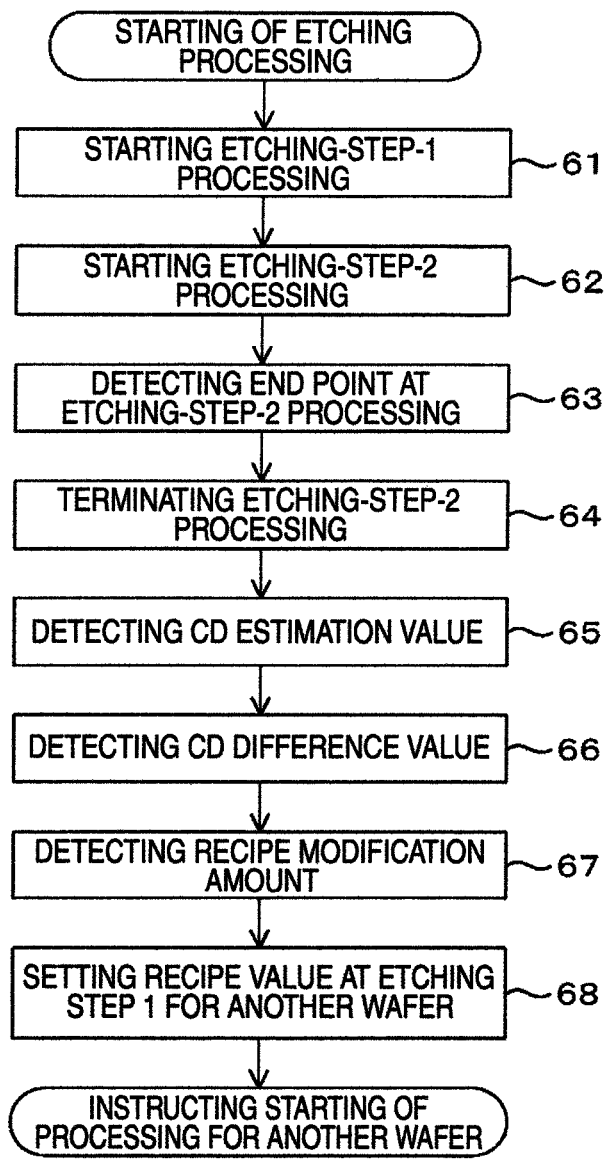
FIG. 6 is a flowchart for illustrating a flow of the operation based on which the plasma processing apparatus according to the embodiment illustrated in FIG. 1 performs the etching processing of the wafers.

Next, referring to FIG. 6, the explanation will be given below regarding a flow of the operation for processing the plural pieces of wafers 6 in the present embodiment. FIG. 6 is a flowchart for illustrating the flow of the operation based on which the plasma processing apparatus according to the embodiment illustrated in FIG. 1 performs the etching processing of the plural pieces of wafers 6. Hereinafter, the explanation will be given below concerning the respective steps in sequence.

As described earlier, first, a piece of wafer 6 is transported onto the mounting surface of the sample stage 7 inside the processing chamber 2 by a not-illustrated transporting robot. After that, the wafer 6 is held on the mounting surface. After that, the inside of the processing chamber 2 is sealed, then supplying the processing gas therein. Moreover, the plasma 8 is formed inside the processing chamber 2, then starting the etching processing such that the film structure on the wafer 6 illustrated in FIGS. 3A and 3B is employed as the target for the etching processing.

After the starting of the etching processing, at a step 61, the instruction and information are issued from the control unit 15. In this way, the condition (i.e., recipe) for the predetermined etching processing whose target is the etching target film A 24 is implemented, then starting the etching processing at the step 1. As described earlier, the processing at the step 1 is continued during a time-interval determined in advance. After that, if it is detected that this scheduled time-interval has elapsed, the processing at the step 1 is terminated based on the instruction from the control unit 15.

Next, the recipe at the step 2 is set based on the instruction and information that are issued from the control unit 15 so that the condition which is suitable for the processing of the etching target film B 25 will be implemented. Then, the processing at the step 2 is started while the operation is being adjusted in harmony with this recipe set (step 62). During the continuation of the processing at the step 2 with respect to the etching target film B 25, the light-emission of the plasma 8 formed as described earlier is received by the light receiver 13. Furthermore, the information on the intensity of the light-emission is transmitted as the signal to the calculation unit 14 on each predetermined time-interval basis.

In the etching end-point detection unit 141 that has received the signal transmitted thereto, the end-point judgment on the processing at the step 2 is carried out. The signal transmitted thereto is stored and processed as the time-sequence signal, then detecting the presence or absence of a specified variation corresponding to the end point. While it is not being judged that this variation is detected, the processing at the step 2 is continued. Meanwhile, if the specified variation is detected in the etching end-point detection unit 141, it is judged that the processing attains to the end point (step 63). When the end point of the processing of the etching target film B 25 is detected, the etching processing at the step 2 illustrated in FIGS. 3A and 3B is halted and terminated (step 64).

If, in the etching end-point detection unit 141, it is judged that the processing attains to the end point, the end-point time of the etching processing at the step 2 illustrated in FIGS. 3A and 3B is detected. Then, the end-point time detected is transmitted to the CD-estimation-value calculation unit 142. Moreover, the CD-estimation-value calculation unit 142 calculates the CD estimation value, using the calculator, and using the information on this end-point time, the recipe information and wafer product information transmitted in advance from the control unit 15, and the information stored in the end-point-time-CD database 145 (step 65).

The CD estimation value calculated is transmitted to the CD-difference-value calculation unit 143. Then, the CD-difference-value calculation unit 143 calculates the CD difference value, using the calculator, and using this CD estimation value, the recipe information and wafer product information transmitted from the control unit 15, and the information stored in the CD-target-value database 146 (step 66). Furthermore, the CD difference value calculated is transmitted to the recipe-modification-amount calculation unit 144. Then, the recipe-modification-amount calculation unit 144 calculates the recipe modification amount, using the calculator, and using the CD difference value calculated in the CD-difference-value calculation unit 143, the recipe information and wafer product information transmitted from the control unit 15, and the information stored in the recipe-modification-amount-CD-difference-value database 147 (step 67). At this time, the unit 144 uses the data on the CD-difference-value-recipe-modification-amount correlation graph 51, which is illustrated in FIG. 5, and acquired using the data obtained from the method such as the experiment, or the values acquired from the approximation expression 52 obtained from the data on the graph 51.

The signal indicating the information on values of the obtained recipe modification amount is transmitted to the control unit 15 that is connected to the calculation unit 14 via a communications unit. In the inside of this control unit 15, the recipe values at the step 1 are calculated with respect to the recipe which becomes the target for the modification, and based on the information on the recipe modification amount transmitted from the recipe-modification-amount calculation unit 144. In addition, the recipe values are set as the recipe for the processing at the step 1 with respect to the etching target film A 24 of the next wafer 6 (step 68). After that, the control unit 15 calculates an instruction for adjusting the operation amount of each component of the plasma processing apparatus 1, then issuing the instruction signal and starting the processing of the next different wafer 6.

The execution of the flow of the operation described above makes it possible to suppress a variation in the dimension caused to occur as a result of the etching processing. Accordingly, it becomes possible to provide the plasma processing apparatus or plasma processing method which allows implementation of an enhancement in the stability or reproducibility of the processing.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method for applying an etching processing to each of wafers using at least two steps of said etching processing, comprising:
    locating one wafer within a pressure-reduced processing chamber inside a vacuum vessel, said one wafer having on a silicon-composed substrate, a film structure which includes a mask and at least one processing-target film located under said mask;
    generating plasma within said processing chamber; and
    after that, applying an etching processing to said film structure using said at least two steps for said etching processing, wherein
    another wafer, having a same film structure as said one wafer and to be processed succeeding to said etching processing of said one wafer, is processed in such a manner that a processing condition at a step corresponding to said first step of said at least two steps as to said one wafer of said etching processing in said processing of said another wafer, is adjusted based on a result obtained by detecting a time between starting and termination of the second step of said etching processing as to said one wafer.

2. The plasma processing method according to claim 1, further comprising:
    processing said at least one processing-target film of said one wafer at said first step during a first processing time determined in advance, said first processing time being included in a first processing recipe for said first step;
    detecting light-emission of said plasma generated during said processing of said at least one processing-target film of said one wafer at said second step, thereby to judge an end point of said second step; and
    adjusting said processing condition at said step corresponding to said first step as to said another wafer in response to a relationship between a length or duration of said detected time length or duration and a reference length or duration of said time between starting and termination of the second step of said etching processing as to said one wafer.

3. The plasma processing method according to claim 1, wherein
    said at least one processing-target film of said film structure include an antireflection film and a film, said antireflection film being located under said mask, and being composed of an organic material, said film being located under said antireflection film, and being composed of silicon nitride,
    said first step processing said antireflection film, and said second step processing said film composed of said silicon nitride.

4. The plasma processing method according to claim 3, further comprising:
    processing said antireflection film at said first step using a gas whose composition includes fluorocarbon and nitrogen; and
    processing said film composed of said silicon nitride at said second step using a gas whose composition includes fluorocarbon.

* * * * *